United States Patent [19]

Weise

[11] 4,435,846
[45] Mar. 6, 1984

[54] AUTOMATIC GAIN CONTROL OF A SINGLE GATE GAAS FET AMPLIFIER

[75] Inventor: Volker B. Weise, Redwood City, Calif.

[73] Assignee: GTE Automatic Electric Incorporated, Northlake, Ill.

[21] Appl. No.: 366,495

[22] Filed: Apr. 8, 1982

[51] Int. Cl.³ .......................... H04B 1/16; H03G 3/20
[52] U.S. Cl. .................................... 455/253; 455/343; 330/129; 330/277; 330/279; 330/297
[58] Field of Search .............. 455/234, 239, 245, 253, 455/343, 248; 375/98; 330/277, 279, 282, 285, 296, 297, 127, 129, 135, 140

[56] References Cited

U.S. PATENT DOCUMENTS

| | | | |
|---|---|---|---|
| 4,066,977 | 1/1978 | Chambers | 330/129 |
| 4,178,482 | 12/1979 | Ouellette | 455/234 |
| 4,229,707 | 10/1980 | Suganuma | 330/285 |
| 4,366,450 | 12/1982 | Suganuma | 330/285 |

Primary Examiner—Jin F. Ng
Attorney, Agent, or Firm—Leonard R. Cool

[57] ABSTRACT

RF preamplification with AGC is employed because of the wide range of signal levels to which the RF input section of a radio is subjected. A reduction in noise figure is obtained by using a single gate gallium arsenide field effect transistor (GaAs FET) as the RF preamplifier and providing an AGC control signal to vary the gain of the RF preamplifier so that the subsequent circuits are not overloaded when high RF signal levels appear at the input.

4 Claims, 6 Drawing Figures

AUTOMATIC GAIN CONTROL OF A SINGLE GATE GAAS FET AMPLIFIER

BACKGROUND OF THE INVENTION

1. Field of the Invention

This invention relates to automatic gain control circuits (AGC) and in particular AGC control of a single gate gallium arsenide (GaAs) FET amplifier.

2. Background Description

In digital radio systems, it is important to use modulation techniques which increase the number of bits per second per Hertz. As a result a number of multi-level modulation techniques have been devised for such use. One effect of these modulation techniques is to require a fairly high degree of linearity in the receiver input sections of such radio systems.

Because of spectrum utilization requirements, the frequencies most often available for digital radio systems are in the 11 GHz range and higher although some systems operate in the 6–8 GHz range. Such frequencies are adversely affected by rain. For example, it is well known that at 11 GHz rain attenuation is a major obstacle to the attainment of long path lengths between repeaters. A detailed study of this phenomena was made and was reported by S. H. Lin in an article, "Statistical Behavior of a Fading Signal", Bell System Technical Journal, Vol. 50, No. 10 December 1971, p. 3211. Because of the rain attenuation margin required as well as other factors, a dynamic operating range in the order of 60 dB appears to be realistic, particularly for the high rain areas. The dynamic range is defined as the difference between the maximum and minimum received signal levels (RSL) for a bit error rate (BER) of $1 \times 10^{-6}$. The minimum (RSL) is determined by the noise figure (NF) of the receiver and the signal-to-noise ratio required for the modulation technique employed. The maximum (RSL) depends on the sensitivity of the modulated signal to non-linearity plus resultant AM to PM conversion which is caused by a high RSL. In order to use the available RF spectrum efficiently, higher order modulation schemes must be used. Signals containing amplitude modulation (16 QAM) are obviously more sensitive to amplitude compression than constant envelope signals such as are obtained in a 8 phase modulation technique (8 $\phi$ PSK). The following table shows the effects that the different dynamic ranges have on the maximum path length at 11 GHz:

| Dynamic Operating Range | Tampa, Fla. (km) | Wilmington, N.C. (km) | Portland, Ore. (km) |
|---|---|---|---|
| 60 dB | 10.4 | 11.3 | 25 |
| 55 dB | 8.9 | 9.6 | 21.3 |
| 50 dB | 7.5 | 7.9 | 18.1 |
| 45 dB | 6.4 | 6.9 | 15 |

The sites selected represent the full range of expected conditions: (a) extreme rain rates (b) typical Eastern and Midwestern locations (c) few intense thunderstorms.

From the table above it can be seen that a dynamic range of 60 dB or more is highly desirable, because it determines the maximum useable hop length. Unfortunately this leads to a extremely high RSL for the system. For example, a 16 QAM system with a guaranteed threshold level of −70 dbm will have a maximum receive signal level of at least −10 dbm, a level at which the receiver input must still be linear.

A typical receiver input consists of an RF receive filter, low loss mixer and IF preamplifier with automatic gain control. Although such a receiver is not shown in detail, the elements 1, 2, 4, 6, 14 and 16 as shown in FIG. 1 would make up such a receiver input circuit. A receiver NF between 7 dB and 8 dB can be obtained with such a circuit if the IF preampliflier NF is kept below 1.5 dB. An IF preamplifier with voltage feedback, using a NEC NE64535 transistor and AGC after the input stage gives a typical noise figure of 1.2 dB. The overload characteristic of such a typical receiver input is shown in FIG. 3. The level of inter modulation products (2A-B) from two equal level signals $f_A$ and $f_B$ is used as a measure of linearity of the receiver input configuration. As a result of non-linearity, $2f_A$-$f_B$, $2f_B$-$f_A$, $3f_A$-$2f_B$, $3f_B$-$2f_A$, etc., intermodulation product signals appear at the output of the IF preampliflier. If the 2A-B product level is more than 40 dB below the A or B level, then the system can be considered linear enough for use with the digital modulation techniques currently employed.

The addition of a GaAs FET preamplifier will reduce the system NF to 5 dB, but if no AGC is used ahead of the mixer the overload of the IF premplifier will become worse, actually decreasing the dynamic range of the receiver. Additional RF preamplification could be employed, but this has the effect of overloading the mixer which also adversely affects the available dynamic operating range. A variable attenuator could be inserted between the RF preamplifier and the mixer providing an AGC technique. The insertion of the loss in the RF portion of the receiver would necessitate the use of a second stage of preamplification in order to obtain the required low overall noise figure (NF). But now the second stage of the preamplifier will overload. One way to overcome this problem is to provide a variable gain RF preamplifier.

SUMMARY OF THE INVENTION

A single GaAs FET is used as an RF preamplifier in the input section of a radio receiver and the gain of the GaAs FET is controlled by a direct current voltage (DC control signal) that is derived from and is proportional to the amplitude of the signal which appears at the output of a subsequent circuit which includes a fixed gain amplifier. This DC control signal is used to control the operating power applied to the RF preamplifier, thereby providing AGC action.

DESCRIPTION OF THE DRAWING (S)

DETAILED DESCRIPTION OF THE INVENTION

Figure 1:
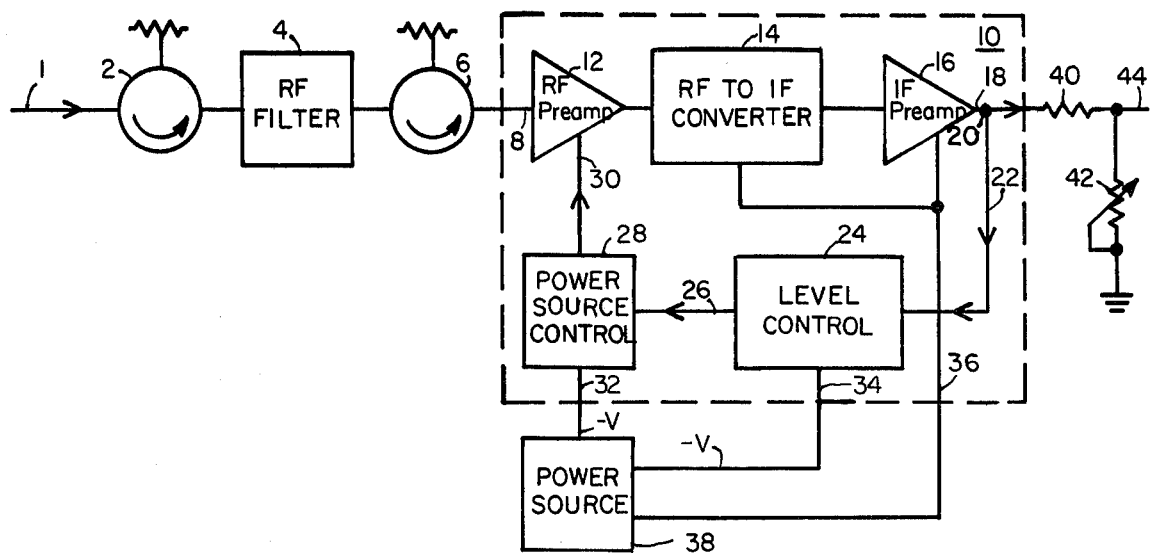
FIG. 1 is a block diagram which illustrates the RF and IF sections of a radio receiver including the AGC circuit of the invention.

Referring now to FIG. 1, the environment in which the AGC circuit of the invention is designed to operate is illustrated. The radio frequency input from the antenna system is applied via path 1 to circulator 2, and thence to an RF filter 4, which limits the band width to the limits for the radio channel, and the band limited signal is passed to circulator 6, then via path 8 to the input of the RF preamplifier 12, which is a variable gain amplifier. The band limited amplifier signal is then applied to the RF to IF converter 14 before it is applied to the input of IF preamplifier 16 which provides an output signal on path 18.

The automatic gain control circuit is connected to path 18 at junction 20 and the IF signal is passed along path 22 to level control 24 and then through path 26 to power source control 28. Here the supply voltage to the RF preamplifier 12 is adjusted so as to control the gain of the RF preamplifier. Power to the radio frequency sections and to the IF section also is supplied via power source 28 as shown in FIG. 1. The automatic gain control circuit can be best understood by referring to the detailed schematic shown in FIG. 2.

Figure 2:
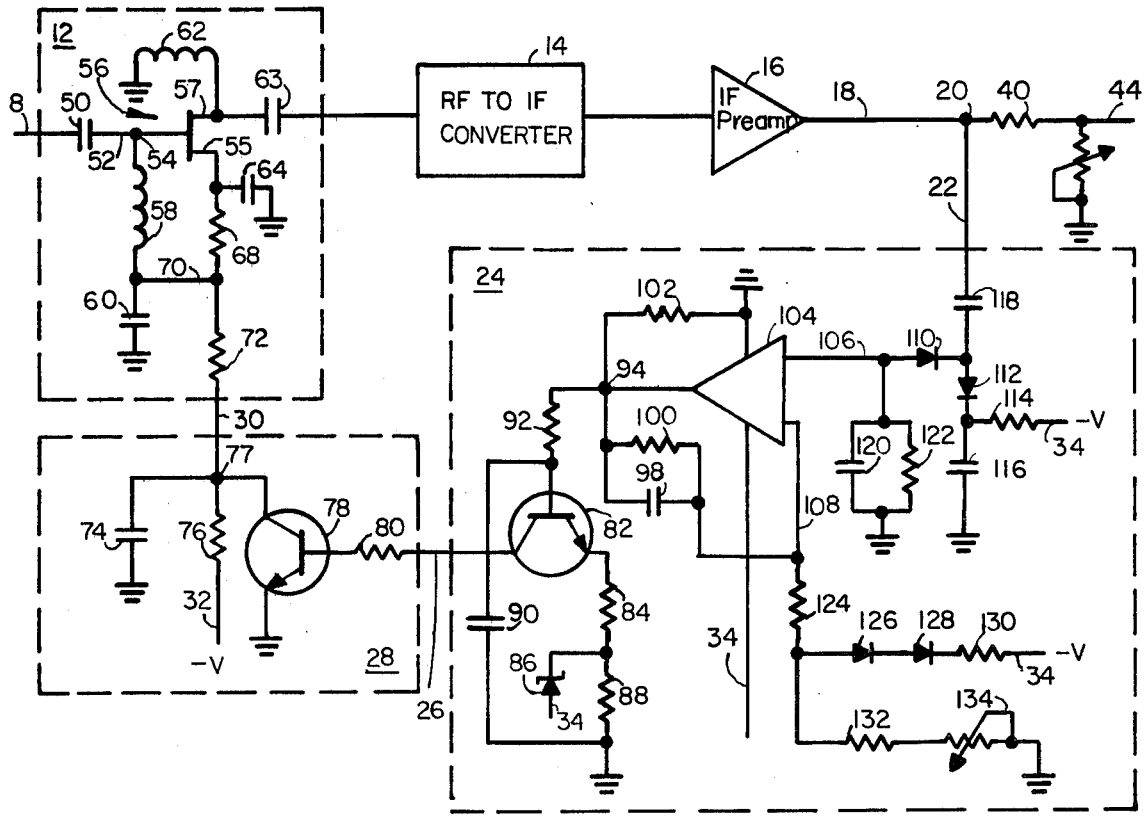
FIG. 2 is a schematic diagram which shows in detail a preferred embodiment of the AGC circuit of the invention.

The general configuration of the single gate GaAs FET transistor amplifier shown as 12 in FIG. 2 is generally conventional. The RF input signal passes through DC blocking capacitor 50 and along path 52 to the gate of the single gate GaAs FET 56. The amplified signal passes through drain electrode 57 and blocking capacitor 63 to the RF input of the RF to IF converter 14.

Figure 3:
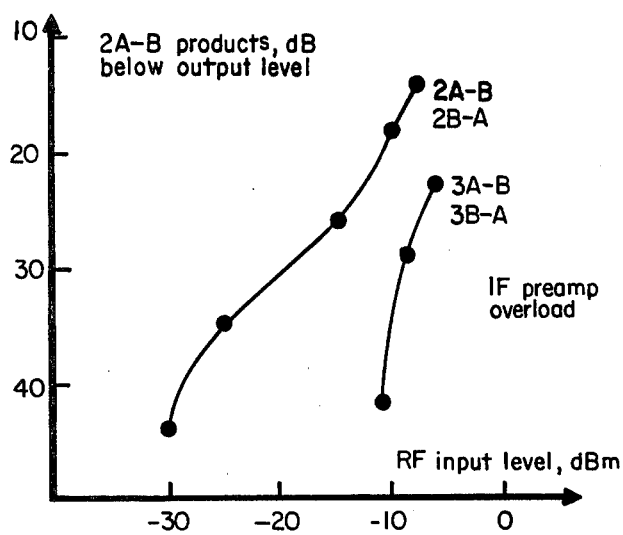
FIG. 3 is a graph of a typical receiver characteristics illustrating the relationship between the RF input level and the amplitude of intermodulation products.

Referring to FIG. 3 it may be seen that the receiver input is linear up to a RF input level of −25 dbm. Improvements are possible by increasing the voltage feedback in the IF preamplifier, but this reduces the system NF because of the increase in IF preamplifier NF.

Figure 4:
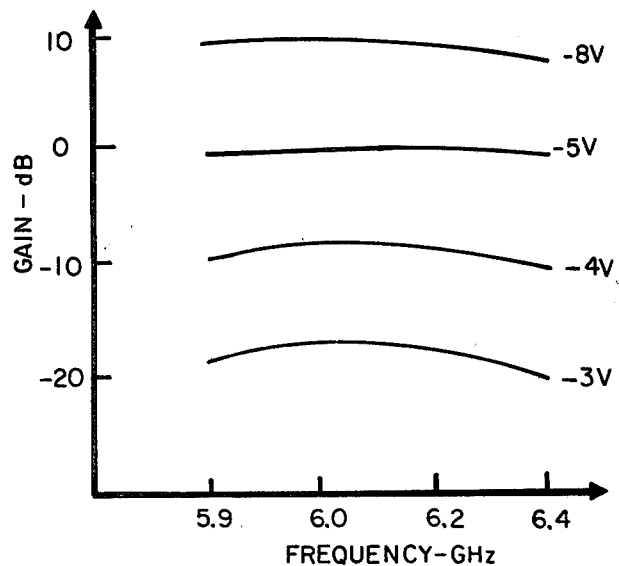
FIG. 4 is a graph illustrating the relationship of the RF Preamplifier gain Vs. Supply Voltage.

FIG. 4 shows how the gain of the amplifier decreases with decreasing supply voltage. Although only the variation in gain with total variation in supply voltage is shown, because this can easily be done, it should be understood that it would be sufficient to change only the gate voltage to obtain a comparable result. Because the gain of the RF preamplifier 12 can be readily accomplished by varying the supply voltage the DC circuit of the RF preamplifier 12, as well as the feedback control circuit are of principle interest to us. Referring again to FIG. 2 and the RF preamplifier circuit 12 it may be seen that the drain is effectively grounded via inductor 62 with respect to the DC supply voltage circuit. In contrast the source is effectively grounded via capacitor 64 with respect to the RF signal but is isolated from ground via capacitor 64 and 60 with respect to the DC supply current. DC bias between the gate and source is provided across resistor 68 path 70 and inductor 58 to junction 54, with the inductor 58 providing RF isolation of the biasing circuit. DC voltage from power source 38 is applied via path 32 to resistor 76 and resistor 72 to the biasing circuit between the gate and the source of the GaAs FET 56. At the junction 77, between resistors 72 and 76, a variable impedance in the form of the transistor 78 is provided so as to permit variation in the supply voltage to preamplifier 12.

As is well known, the collector-emitter impedance of transistor 78 may be varied by varying the bias voltage between the base and emitter electrodes of the transistor. Such a bias voltage is obtained here as a function of the output signal level of IF preamplifier 16. The amplified IF signals are intercepted at junction 20 and applied along path 22 to the input of level control 24 via blocking capacitor 118 to the junction between the diodes 110 and 112. The negative supply voltage from power supply 38 applied along path 34 to one terminal end of resistor 144 essentially forward biases diodes 110 and 112 via resistor 122, which is connected to ground. These diodes provide a voltage divider function as well as rectification of the alternating current RF signal. A portion of the rectified signal is applied to the one input of differential amplifier 104 via path 106.

Capacitor 120 provides a voltage regulating function and with resistor 122 sets a time constant. A fixed bias signal is provided to the other input path 108 of the differential amplifier 104, and this voltage is adjustable via adjustable resistor 134.

The RC network comprising capacitor 98 and resistor 100 at the output of differential amplifier 104 is selected so as to provide the time constant necessary to obtain approximately 100 dB/sec. fade compensation. Multipath fading causes the input level to change at a maximum rate of 100 dB/s in microwave systems. Here though, we are concerned with rain attenuation, so as the 100 dB/s is not of primary concern. Resistor 134 is used to set the output level of the level control 24 so that the bias of transistor 78 is such as to cause the RF preamplifier to operate in a desired gain range. Transistor 82 and its associated elements provide a constant DC gain for the DC output from differential amplifier 104. As a result the base-emitter bias voltage of transistor 78 is adjusted in accordance with the variations of the output of IF preamplifier 16 which, in turn, varies the collector-emitter impedance between junctions 77 and ground. In effect this transistor 78 acts as a shunt regulator to vary the bias voltages applied to the RF preamplifier. Thus the gain of the RF gain preamplifier will change depending upon how much current is shunted through transistor 78, which, in turn, is a function of the IF signal level, and automatic gain control is achieved. Below a certain low input level, the RF Preamplifier gain becomes constant.

Figure 6:
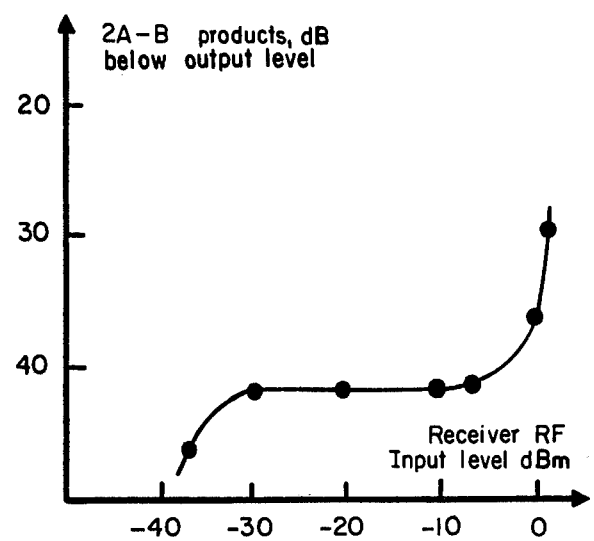
FIG. 6 is a graph which shows the overload performance of a complete receiver in which the invention is used.

In building an amplifier to perform the functions described hereinabove, the techniques was tested using a 6 GHz GaAs FET amplifier which employed an Alpha ALF 1003 device. It was operated from a −8 volt supply and the amplifier current was 20 milliamperes and the circuit provided a gain of 11 dB in the frequency range from 5.9 to 6.4 GHz. The RF preamplifier was designed to provide a −23 dbm output level with normal adjustment of the gain control loop from the IF preamplifier. The levels in the feedback loop were chosen so that an RF level input of −60 dbm the RF preamplifier output level was −23 dbm. With the filter and mixer loss plus the IF preamplifier gain of 24.5 dB, the IF output level was −5 dbm. At a RF input level of −32.7 dbm the output level of the Rf preamplifier is also −23 dbm thus allowing the IF preamplifier output level to remain at −5 dbm. In this design there was no AGC action for RF levels below 32.7 dbm. In testing the unit it was noted that the overload performance of a complete receiver input circuit was above the stated requirement in that the 2A-B products remained 43 dB below the A or B level and thus exceeded the 40 dB level by 3 dB to and input level of −4 dbm. This is also shown in FIG. 6.

Figure 5:
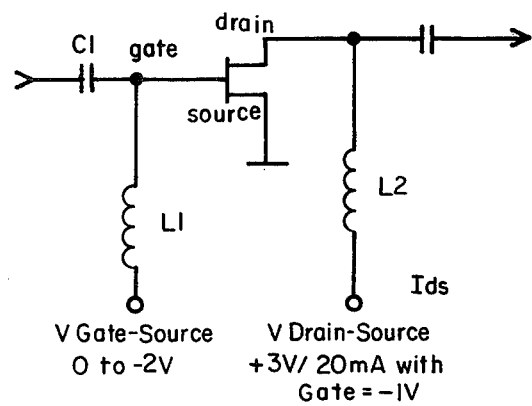
FIG. 5 is a schematic diagram which illustrates how the gain of the RF Preamplifier may be controlled by varying only the gate voltage.

In an alternate embodiment of the invention it was shown that the grain of the amplifier decreases if only the gate voltage is varied. In this case an amplifier with a separate drain and gate supply must be built and an example of such an arrangement is shown in FIG. 5. It should be noted that only the biasing method is shown in FIG. 5. For proper operation the drain to source current is again adjusted to 20 milliamps with the drain to source voltage equal to 3 volts, and this was achieved by selecting a gate to source voltage of −1 volt. As the gate to source voltage is adjusted toward 0, the gain of the amplifier decreases in the same manner as if the total supply voltage is varied. Thus AGC action is similar to that obtained by varying the total GaAs FET supply voltage.

While the invention has been particularly shown and described with reference to preferred embodiments thereof, it will be understood by those skilled in the art that change in form and detail may be made therein without departing from the spirit and scope of the invention.

What is claimed is:

1. In a radio receiver operating in the GHz radio frequency (RF) range, and adapted to receive a modulated RF input signal, an automatic gain control (AGC) circuit comprising;
   a controllable power source having a control input and including means for supplying direct current (DC) operating voltage between a supply line and a ground plane, said DC operating voltage having a magnitude;
   an RF preamplifier which includes a single GaAs FET having gate, drain and source electrodes, and biasing means connected to said DC operating voltage, said gate electrode being adapted to receive said RF input signal, said drain electrode being AC isolated and DC connected to said ground plane, and said source electrode being connected to said biasing means, said FET providing an amplified RF signal at the drain electrode, the RF preamplified gain varying in response to variations in the magnitude of the DC operating voltage supplied by said controllable power source;
   circuit means having an input adapted to receive said amplified RF signal, said circuit means including a fixed gain amplifier, and providing an amplified IF signal at an output;
   a level control circuit having an input adapted for connection to the output of said circuit means, said level control circuit being responsive to the amplitude of said amplified IF signal so as to provide a variable DC control signal to the control input of said controllable power source, whereby the gain of the RF preamplifier is varied inversely to the amplitude of said amplified IF signal, so as to substantially maintain the amplitude of said amplified IF signal constant over a predetermined range of RF input signal amplitudes.

2. An AGC circuit as in claim 1 wherein said controllable power source comprises:
   a first resistor having first and second terminals, said first terminal being connected to said control input;
   a second resistor having first and second terminals, said first terminal being connected to said supply line; and
   a bipolar transistor having a base, emitter, and collector, said base being connected to said first resistor's second terminal, said emitter being connected to said ground plane, and said collector being connected to said second resistor's second terminal and providing said DC operating voltage by acting as a variable impedance between said ground plane and said supply line.

3. Apparatus or set forth in claim 2 wherein said circuit means comprises:
   an IF section for converting the frequency of the amplified RF signal to an IF signal; and
   an IF preamplifier adapted to receive said IF signal at an input and to provide said amplified signal at the circuit means output, said IF preamplifier applying a substantially constant gain to the IF input signal.

4. Apparatus as set forth in claim 3 wherein said level control comprises:
   a rectifier adapted to receive said IF signal at an input and providing a variable DC signal at an output;
   a differential amplifier having one input terminal connected to receive the variable DC signal, having a preselected voltage applied to a second input so as to set the operating range of the automatic gain control circuit, and an output;
   a network, adapted for connection to said output, which establishes the rate of change in the AGC circuit in dB/sec.; and
   a constant gain DC amplifier having an input port and output port, said input port being connected to said differential amplifier output, and said output port providing said variable DC control signal.

* * * * *